(12) United States Patent
Malik et al.

(10) Patent No.: US 8,169,246 B2
(45) Date of Patent: May 1, 2012

(54) DYNAMIC-TO-STATIC CONVERTER LATCH WITH GLITCH SUPPRESSION

(75) Inventors: Khurram Z. Malik, Santa Clara, CA (US); Andrew L. Arengo, San Jose, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 12/713,904

(22) Filed: Feb. 26, 2010

(65) Prior Publication Data

US 2011/0210775 A1 Sep. 1, 2011

(51) Int. Cl.
*H03K 3/356* (2006.01)
(52) U.S. Cl. .................................... 327/211
(58) Field of Classification Search ............. None
See application file for complete search history.

(56) References Cited

U.S. PATENT DOCUMENTS

| | | | |
|---|---|---|---|
| 6,469,953 B1 | 10/2002 | Hong | |
| 6,657,972 B1 | 12/2003 | Syed et al. | |
| 6,815,977 B2 | 11/2004 | Sabbavarapu et al. | |
| 6,977,528 B2 * | 12/2005 | Kang et al. | 326/121 |
| 6,989,691 B2 * | 1/2006 | Campbell | 326/95 |
| 7,098,695 B2 * | 8/2006 | Malik | 326/95 |
| 7,239,565 B2 | 7/2007 | Liu | |
| 7,827,018 B2 * | 11/2010 | Adams et al. | 703/14 |

* cited by examiner

*Primary Examiner* — Lincoln Donovan
*Assistant Examiner* — Sibin Chen
(74) *Attorney, Agent, or Firm* — Lawrence J. Merkel; Meyertons, Hood, Kivlin, Kowert & Goetzel, P.C.; Erik A. Heter

(57) ABSTRACT

A latch circuit. The latch circuit may include an input circuit, a precharge circuit, and a transfer circuit. The precharge circuit may precharge a first node during a first phase of a clock signal. Based on an input signal received at a first logic value, the input signal may drive the first node to a second logic value during the second clock phase. The transfer circuit may include a discharge circuit that is active during an evaluation phase beginning at a delay time subsequent to the clock signal entering the second phase and ending when the clock signal re-enters the first phase. The transfer circuit may also include pull-up and pull-down transistors, one of which may drive a logic value to a second node during the evaluation phase.

20 Claims, 7 Drawing Sheets

DYNAMIC-TO-STATIC CONVERTER LATCH WITH GLITCH SUPPRESSION

BACKGROUND

1. Field of the Invention

This invention relates to electronic circuits, and more particularly, to latch circuits.

2. Description of the Related Art

Latch circuits are commonly known in the electronic arts. Typical latch circuits have two stable states and may thus be usable for storing a bit of logical information (e.g., a logic 0 or a logic 1). Latch circuits come in a wide variety of forms, from very simple latches to more complex circuits. Latches may also be dynamic (e.g., having a precharge phase and an evaluation phase during operations) and static (e.g., having no precharge).

One type of latch circuit is known as a set-dominant (or zero-keeper) latch. In various embodiments, a set-dominant latch is a dynamic latch that captures a dynamic input that operates in a precharge phase and an evaluation phase and supplies a static output corresponding to the dynamic input. The precharge phase occurs during a first phase of a clock signal (e.g., when the clock is low), while the evaluation phase is performed during a second phase of the clock signal (e.g., when the clock is high). A set-dominant latch can be used in conjunction with domino dynamic circuits. Furthermore, when used in conjunction with domino logic, a set-dominant latch provides a path to convey logic signals from dynamic logic to static logic.

The set-dominant latch is susceptible to a glitch on the output that can occur when the clock to the latch transitions to the evaluate phase and the dynamic input signal has not yet been precharged. The glitch can cause unnecessary power consumption, reducing battery life in mobile devices.

SUMMARY

A dynamic-to-static latch circuit is disclosed. In one embodiment, the latch circuit includes a first data node onto which a dynamic input can be driven. The first data node may be precharged by a precharge circuit configured during a first phase of a clock signal. A transfer circuit may include pull-up and pull-down transistors, each having a corresponding gate terminal coupled to the first data node. The pull-up transistor may, when active, provide a pull-up path between a second data node and a voltage supply node. The transfer circuit may also include a discharge circuit coupled to the pull-down transistor. The discharge circuit may become active during an evaluation that begins at a delay time subsequent to the clock entering the second phase, and may end when the clock signal ends the second phase (i.e. re-enters the first phase). The pull-down transistor, when active during the evaluation phase, may provide a pull-down path between the second node and a ground node. An output circuit coupled to the transfer circuit may capture and store the logic value present on the second node during the evaluation phase.

In one embodiment, the discharge circuit of the latch may include a first transistor, a second transistor, and a delay circuit. A gate terminal of the first transistor may be coupled to receive the clock signal. The first transistor may become active when the clock transitions from the first phase (e.g., low) to the second phase (e.g., high). The delay circuit may also receive the clock signal, introducing a delay (and thus providing a delayed clock signal). The delayed clock signal may be provided to a gate terminal of the second transistor. The evaluation phase may begin when the delayed clock signal transitions to its second phase, which may in turn activate the second transistor. If the pull-down transistor is active during the evaluation phase, the second node may be driven to a logic low through a pull-down path through the pull-down transistor and the first and second discharge transistors. The evaluation phase may end when the clock signal re-enters its first phase, thereby causing deactivation of the first transistor.

As noted above, the latch may include an output circuit coupled to the transfer circuit may capture the logic value on the second node during the evaluation phase and store is subsequent to the end of the evaluation phase. The output circuit may be implemented as a keeper or other suitable storage circuit. The logic value captured and stored in the output circuit may be retained at least until the next occurrence of the evaluation phase.

Since the output circuit may store a logic value subsequent to the evaluation phase, the latch circuit described herein may be provide a transition path from dynamic logic circuitry to static logic circuitry. In one embodiment, an integrated circuit (IC) may include a number of dynamic logic circuits and a number of static logic circuits. Corresponding instances of a dynamic-to-static latch circuit may be coupled between the various ones of the dynamic and static logic circuits. Logic signals generated in the dynamic logic circuits may be conveyed to the static logic circuit by the dynamic-to-static latches.

Dynamic-to-static latches such as those described herein may also be used in register files. Dynamic-to-static latches may be provided for each data bit, and may capture the outputs from the register file memory array. Alternatively or in addition, if dynamic data inputs are provided to the register file to write the register file array, dynamic to state latches may be used on the inputs to drive data bits to a bit line (and/or bit line driver) that can be written to corresponding storage cells.

The configuration of the transfer circuit may enable implementation of dynamic-to-static converter circuit that may be free of glitches that may otherwise occur and could lead to erroneous operation. More particularly, by delaying the commencement of the evaluation phase for a delay time following the beginning of the second phase of the clock signal may in turn lead to glitch-free operation even in the case that the precharge of the input has not yet occurred.

BRIEF DESCRIPTION OF THE DRAWINGS

The following detailed description makes reference to the accompanying drawings, which are now briefly described.

Figure 1:
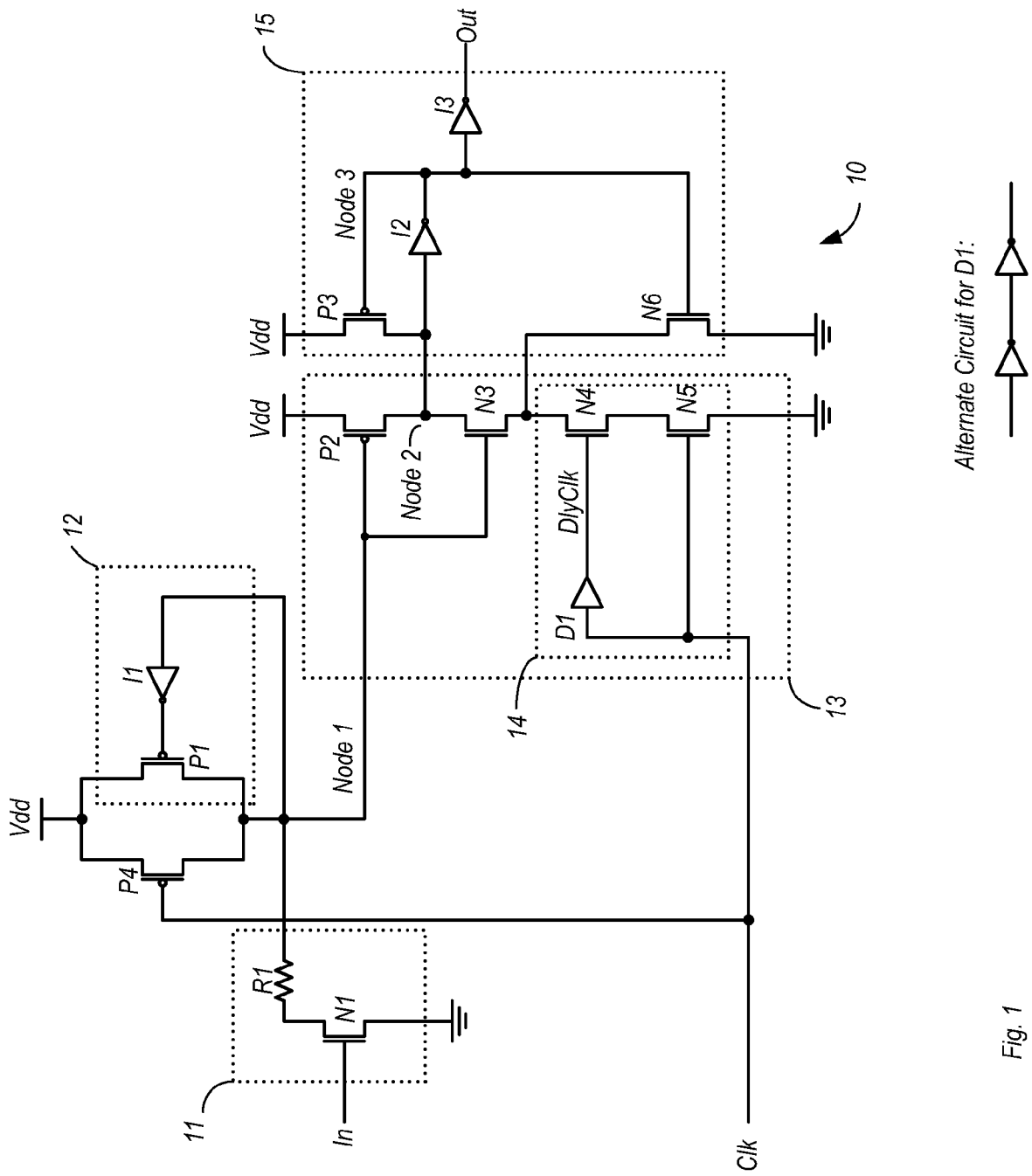
FIG. 1 is a schematic diagram of one embodiment of a latch circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Embodiments of a Dynamic-to-Static Converter Latch

Figure 2:
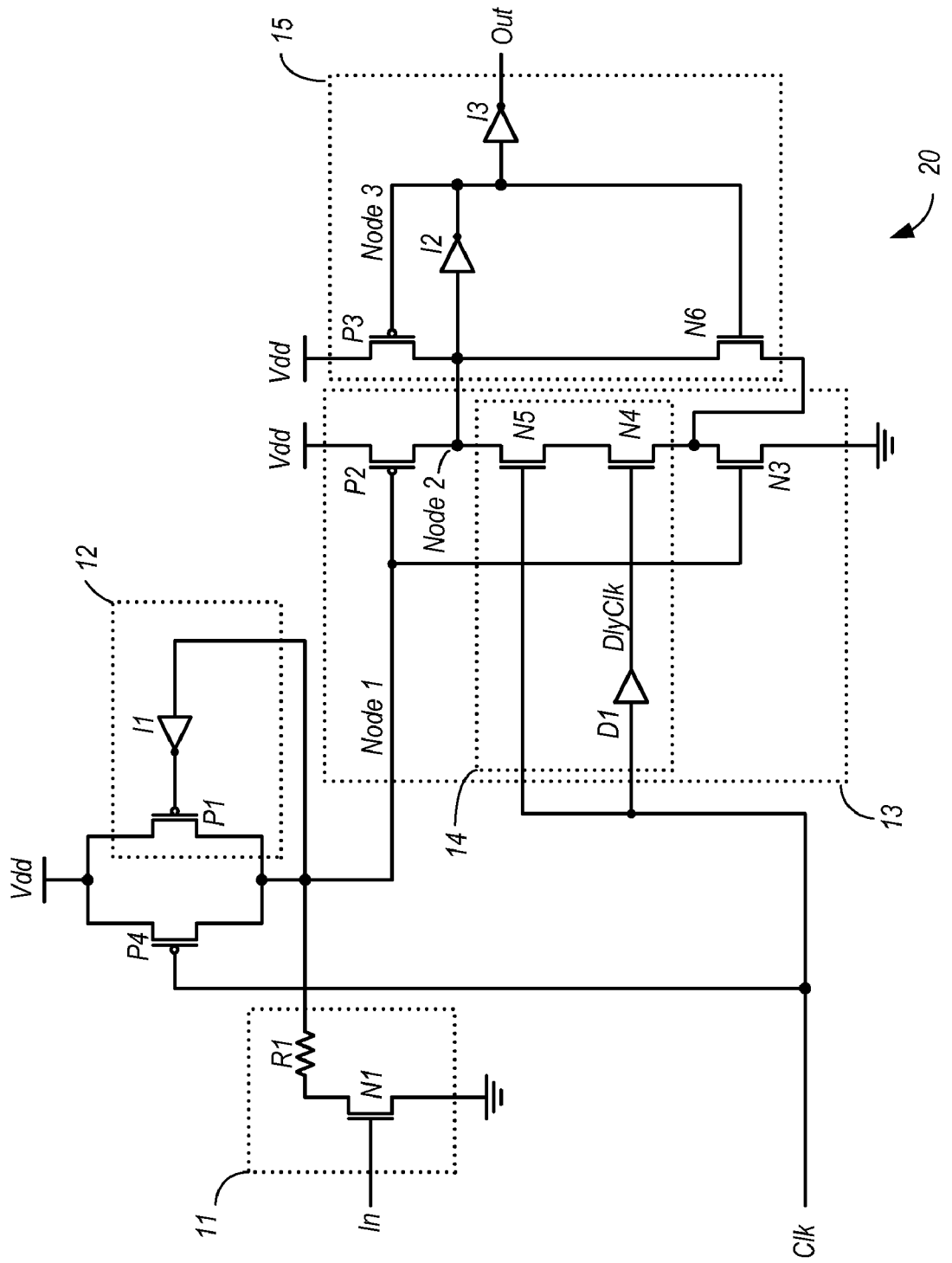
FIG. 2 is a schematic diagram of another embodiment of a latch circuit.
Figure 3:
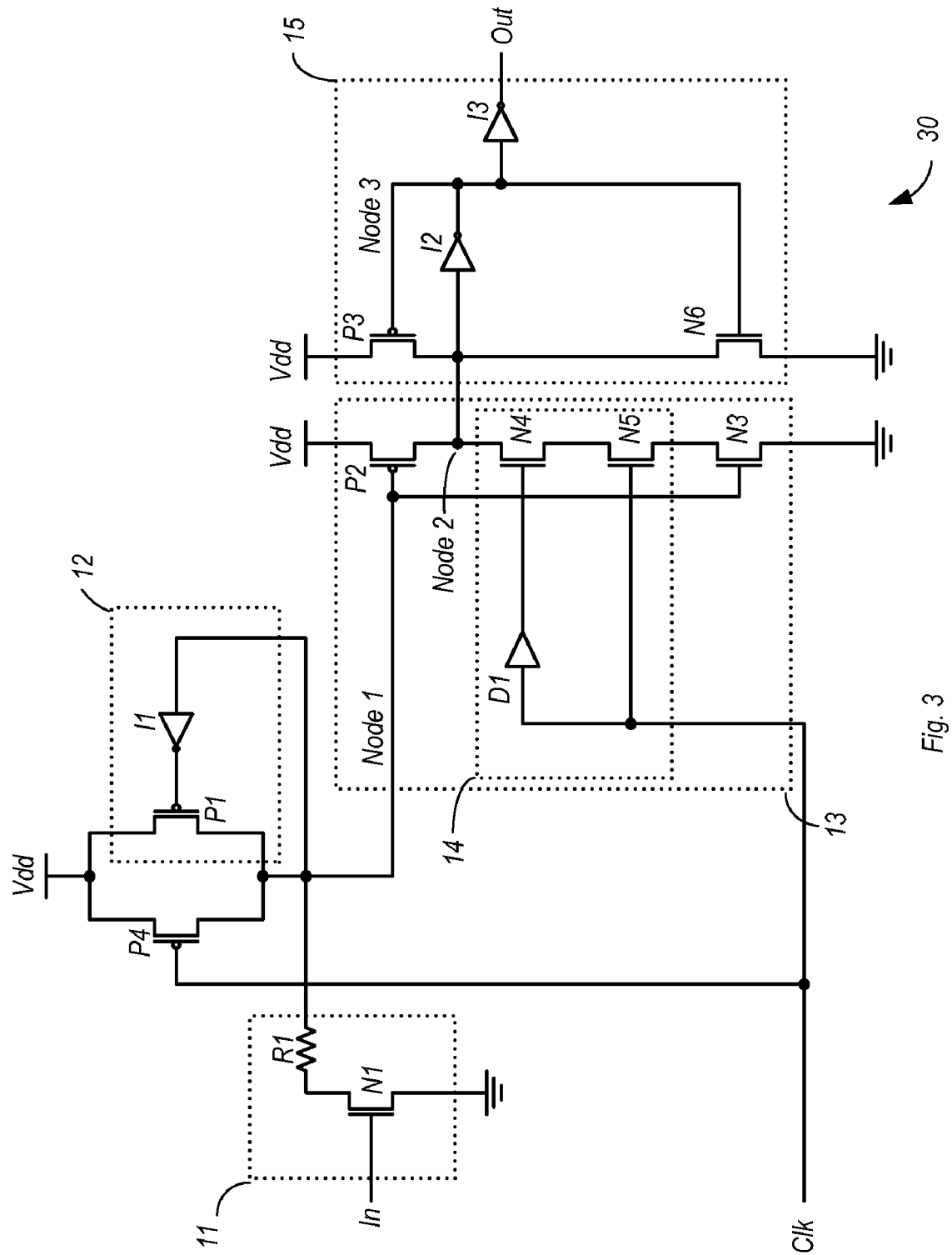
FIG. 3 is schematic diagram of a third embodiment of a latch circuit.

FIGS. 1-3 illustrate various embodiments of a dynamic-to-static latch circuit (sometimes known as a set-dominant latch, a zero-keeper latch, or a dynamic-to-static converter). Latch circuit 10 is illustrated in FIG. 1, latch circuit 20 is illustrated in FIG. 2, and latch circuit 3 is illustrated in FIG. 3. Latch circuits 10, 20, and 30 may each be configured to receive output signals provided by dynamic logic circuits, and may convey these signals to static logic circuits. Dynamic logic circuits may be those logic circuits that may implement a logic function (e.g., a NAND function), but whose operation includes a precharge phase (to precharge an output node) and an evaluation phase (to evaluate the logic function). A dynamic logic circuit may thus be coupled to receive a clock signal. The precharge phase of operation for a dynamic logic circuit may occur during a first phase of the clock signal (e.g., when the clock signal is low), while the evaluation phase may occur during a second phase of the clock signal (e.g., when the clock is high).

The dynamic-to-static latch circuits illustrated in FIGS. 1-3 may include local circuitry to delay the clock input, and to use a combination of the delayed clock and the clock input to create a point of divergence between the precharge of the input node of the latch and the beginning of the evaluation phase of the latch. The point of divergence may be designed to be wide enough to avoid beginning the evaluation phase prior to the precharge of the input node. Accordingly, glitches that might otherwise occur on the output of the dynamic-to-static latch circuits may be avoided. Power may be conserved. Furthermore, solutions for suppressing glitches in conventional dynamic-to-static latch circuits may degrade the hold time associated with precharged nodes driving into a static-to-dynamic latch. However, the circuits shown in FIGS. 1-3 and various embodiments thereof may suppress glitches without any degradation of the hold time. Additionally, locating the delay circuitry local to the dynamic-to-static latch circuits may avoid the need to route two clocks (one for precharge, one delaying the rising edge) throughout an integrated circuit employing the dynamic-to-static latch circuits.

The transistors shown in FIGS. 1-3 that are designated with a 'P' are PMOS (p-type metal oxide semiconductor) transistors. Similarly, transistors shown in FIGS. 1-3 designated with an 'N' are NMOS (n-channel metal oxide semiconductor) transistors. It is noted however that these circuit embodiments are exemplary, and the transistors used to accomplish various functions may be different from one embodiment to the next.

Turning now to FIG. 1, latch circuit 10 is illustrated. In the embodiment shown, latch circuit 10 includes a transfer circuit 13 including a discharge circuit 14, and an output circuit 15. Also illustrated in FIG. 1 for context are an input circuit 11, a half-keeper 12, and a precharge circuit (implemented as transistor P4 in this case). Transistor P4 in the embodiment shown is coupled between Node 1 of latch circuit 10, and a voltage supply node Vdd. A gate terminal of transistor P4 is coupled to receive a clock signal. Since transistor P4 is a PMOS transistor in this embodiment, it may be activated (i.e. turned on) when the clock signal is low. Turning on transistor P4 may in turn pull Node 1 up toward the Vdd voltage.

Input circuit 11 may be coupled to a dynamic logic circuit, and may thus receive the output of the dynamic logic circuit as its input. In the embodiment shown, input circuit 11 is implemented using transistor N1, and may cause a logic value to be driven onto Node 1 during the evaluation phase. The resistor R1 may illustrate a relatively long delay line (e.g. if the input circuit 11 is part of a register file circuit, and the node 1 is a bit line). When the input signal received on the gate terminal of N1 is a logic high, thereby activating N1, Node 1 may be pulled down toward a ground voltage through transistor N1.

If the input signal received on the gate terminal of transistor N1 is a logic low, then transistor P1 may hold Node 1 high when the clock signal is high. In the embodiment shown, transistor P1 is part of half-keeper 12, which also includes inverter I1. Inverter I1 in this embodiment includes an input coupled to Node 1 and an output coupled to the gate terminal of P1. When Node 1 is precharged high, inverter I1 may output a logic low which may in turn activate P1. When active, P1 may provide another pull-up path between Node 1 and Vdd. If transistor N1 remains turned off after the clock signal transitions high, Node 1 may remain at a logic high due to the operation of the half-keeper circuit, and more particularly, due to the pull-up path existing through activated transistor P1. Accordingly, when the clock signal is high, transistor N1 may drive Node 1 low if the input signal is a logic high (thereby activating N1), while transistor P1 may drive Node 1 high if the input signal is a logic low (thereby causing N1 to be inactive). It should be noted that transistor N1 may be sized such that its drive strength is sufficient to overcome that of transistor P1.

In the embodiment shown, Node 1 is the dynamic input to the dynamic-to-static latch 10. Node 1 is coupled to a pull-up transistor P2 and a pull-down transistor N3, which are part of transfer circuit 13. Both pull-up transistor P2 and pull-down transistor N3 have respective gate terminals coupled to Node 1 in this example. Transfer circuit 13 also includes a discharge circuit 14 coupled to pull-down transistor N3. Depending on the logic value present on Node 1 during an evaluation phase of the dynamic-to-static latch 10 (to be discussed in further detail below), a logic low or logic high may be driven onto Node 2 by either pull-down transistor N3 or pull-up transistor P2. In the embodiment shown, if Node 1 is a logic low during the evaluation phase, a logic high may be driven onto Node 2. If Node 1 is a logic high during the evaluation phase, Node 2 may be driven to a logic low.

It should be noted that in the embodiment shown in FIG. 1, Node 2 may remain unaffected during the precharging of Node 1, since transistors P2 is turned off by the precharge and transistor N5 is turned off whenever the clock signal is low. Accordingly, during the precharge phase, no pull-up or pull-down path from Node 2 is provided. As such, Node 2 may be considered a point of conversion from dynamic logic to static logic.

As previously noted, transfer circuit 13 in the embodiment shown includes a discharge circuit 14, which includes discharge transistor N4 and N5, along with delay unit D1. Discharge circuit 14 may provide, in conjunction with pull-down transistor N3, a pull-down path from Node 2 to ground (via transistors N4 and N4), during an evaluation phase. The evaluation phase in this embodiment may begin at a delay time following the clock signal transitioning high. The delay time may be set by delay unit D1. Delay unit D1 in the embodiment shown is implemented with a buffer. FIG. 1 also illustrates an alternate implementation of D1 utilizing two inverters. In general, a wide variety of implementations of delay unit D1 are possible and contemplated, including those with zero inversions of the clock signal (e.g. capacitive delays), as well as embodiments having any even number of inversions of the clock signal. Furthermore, embodiments of D1 that are tunable are also possible and contemplated.

Discharge circuit 14 in the embodiment shown is coupled to receive the clock signal at the input of delay unit D1, and on the gate terminal of discharge transistor N5. Delay unit D1 in this example is configured to introduce a delay into the clock signal, and is coupled to provide the delayed clock signal (DlyClk) to the gate terminal of discharge transistor N4. When the clock signal transitions high, transistor N5 may activate. Transistor N4 may be inhibited from initially becoming active when the clock signal transitions high, but may become active after elapsing of the delay time subsequent to the transition, when the delayed clock signal transitions high. Accordingly, the evaluation phase for the latch 10 may begin at the time when transistor N4 becomes active following the activation of transistor N5. The evaluation phase may be terminated when the clock signal falls low again, thereby turning off discharge transistor N5. Accordingly, the evaluation phase for latch 10 may be less than the entire duration of the high phase of the clock signal, although the evaluation phase and the clock high phase may otherwise be concurrent. The shortening of the evaluation phase relative to the clock high phase may prevent glitches from occurring on Node 2.

If, during the evaluation phase, the input signal received on the gate terminal of transistor N1 is a logic low (thereby inhibiting N1 from activation), Node 1 may remain at a logic high subsequent to the end of the precharge operation (i.e. when the clock transitions high). A logic high on Node 1 may in turn result in the activation of pull-down transistor N3, since its gate terminal is coupled to Node 1. Since the gate terminal of pull-up transistor P2 is also coupled to Node 1, it may remain inactive when pull-down transistor N3 is active.

Once the evaluation phase commences (i.e. when both transistors N4 and N5 become active), a pull-down path may be provided from Node 2 to ground. This may result in a logic low being driven on Node 2, while a logic high may be driven on Node 3 of output circuit 15. Output circuit 15 in this embodiment is arranged such that the logic high on Node 3 and logic low on Node 2 may be held even after the evaluation phase ends. Specifically, the combination of transistors N3 and N6 may hold the logic low on Node 2.

If a logic high is present on the input to transistor N1 after the precharge phase completes (and thus, the clock signal transitions high), Node 1 may be pulled low during the clock high phase. When Node 1 is pulled low, pull-up transistor P2 may become active and may thus drive a logic high value onto Node 2. It is noted that in this case, the driving of the logic high on Node 2 may begin with the activation of pull-up transistor P2, irrespective of when the evaluation phase begins. This is due to the fact that pull-down transistor N3 may be inactive when pull-up transistor P3 is active, and thus no pull-down path is provided in this case even after discharge transistors N4 and N5 both become active. The logic high driven to Node 2 may be captured and held subsequent to the end of the evaluation phase (and the end of the clock high phase) by output circuit 15 that includes inverter I2 and transistors P3 and N6. Specifically, the high on node 2 may be inverted by inverter I2, activated transistor P3 to hold node N2 high.

In addition to including the keeper circuit described above, output circuit 15 also include an inverter I3. Inverter I3 may provide output drive strength from the latch 10 to the circuitry that receives the output (e.g. static circuitry).

It should be noted that the transistors of transfer circuit 13 may be sized such that they provide sufficient drive strength to overdrive the transistor P3 of output circuit 15 in order to effect a change of states on Node 2. For example, the combined drive strength of transistors N3, N4, and N5, when active, may be sufficient to drive Node 2 low from a high held by transistor P3. This in turn may cause inverter I2 to drive Node 3 high, thereby deactivating transistor P3 while activating transistor N6.

In the embodiment shown in FIG. 1, pull-down transistor N3 is directly coupled to Node 2, with discharge transistors N4 and N5 being coupled in series between N3 and ground. In latch circuit 20 shown in FIG. 2, pull-down transistor N3 is coupled between the ground node and discharge transistor N4, which is coupled to receive the delayed clock signal. In latch circuit 30 shown in FIG. 3, pull-down transistor N3 is coupled between the ground node and discharge transistor N5, which is directly coupled to receive the (non-delayed) clock signal. Each of these embodiments may have differing operational aspects relative to the others, which will now be discussed. In general, any configuration of the transistors N3, N4, and N5 may be used in series to form the pull-down leg of the transfer circuit 13. The transistor N3 may be inserted between N4 and N5, for example. N4 and N5 may still be a discharge circuit in such embodiments, enveloping the N3 transistor.

For example, latch circuit 10 of FIG. 1 may respond rapidly to a transition from Node 1 falling low to Node 2 rising to a logic high. This may be the critical delay path through the circuit, and thus the implementation shown in FIG. 1 may be used in embodiments where speed for this particular transition is prioritized as a design parameter. When Node 1 falls low at the end of the precharge phase (due to a logic high on the gate of transistor N1), pull-down transistor N3 may deactivate while pull-up transistor P2 activates. When this occurs, the pull-down path from Node 2 to ground may be blocked, regardless of the particular states of discharge transistors N4 and N5. At the same time, the activation of pull-up transistor P2 may provide the pull-up path from Node 2 to Vdd, thereby pulling Node 2 high. Additionally, since transistor N6 is coupled to the source of the transistor N3 in the illustrated embodiment, the deactivation of N3 further speeds the transition high by preventing N6 from resisting the change.

The latch 30 in FIG. 3 may be respond rapidly to the transition from high on Node 1 to a low on Node 2. Thus, this embodiment may be used when the speed of this particular transition is the critical design parameter. In the embodiment of FIG. 3, pull-up transistor P2 is off while pull-down transistor N3 (which is coupled to ground) is on during the precharge phase. If the input received by the gate is a logic low (resulting in transistor N1 being inactive), then Node 1 may remain at a logic high after the precharge phase ends due to the clock signal transitioning high. Discharge transistor N5, which is coupled to pull-down transistor N3, may turn on next responsive to the low-to-high transition of the clock signal. When the delayed clock signal transitions high, thereby causing the activation of discharge transistor N4, the pull-down path between Node 2 and ground may be complete, and Node 2 may be pulled low. Since the transistors N3 and N5 are already on, draining any charge that may exist on the internal nodes of the discharge circuit, the transition may be rapid.

The embodiment of latch circuit 20 shown in FIG. 2 may have low leakage characteristics. Thus, latch circuit 20 may exhibit low power consumption due to its reduced leakage. Accordingly, latch circuit 20 may be useful in embodiments where minimizing power consumption is prioritized as a design parameter.

While certain types of transistors have been used in specific locations in the embodiments discussed above, such disclosure is not intended to be limiting. For example, embodiments are possible and contemplated wherein the various polarities are reversed, and thus wherein PMOS transistors are used where the present embodiment utilizes NMOS transistors, and vice versa.

Figure 4:
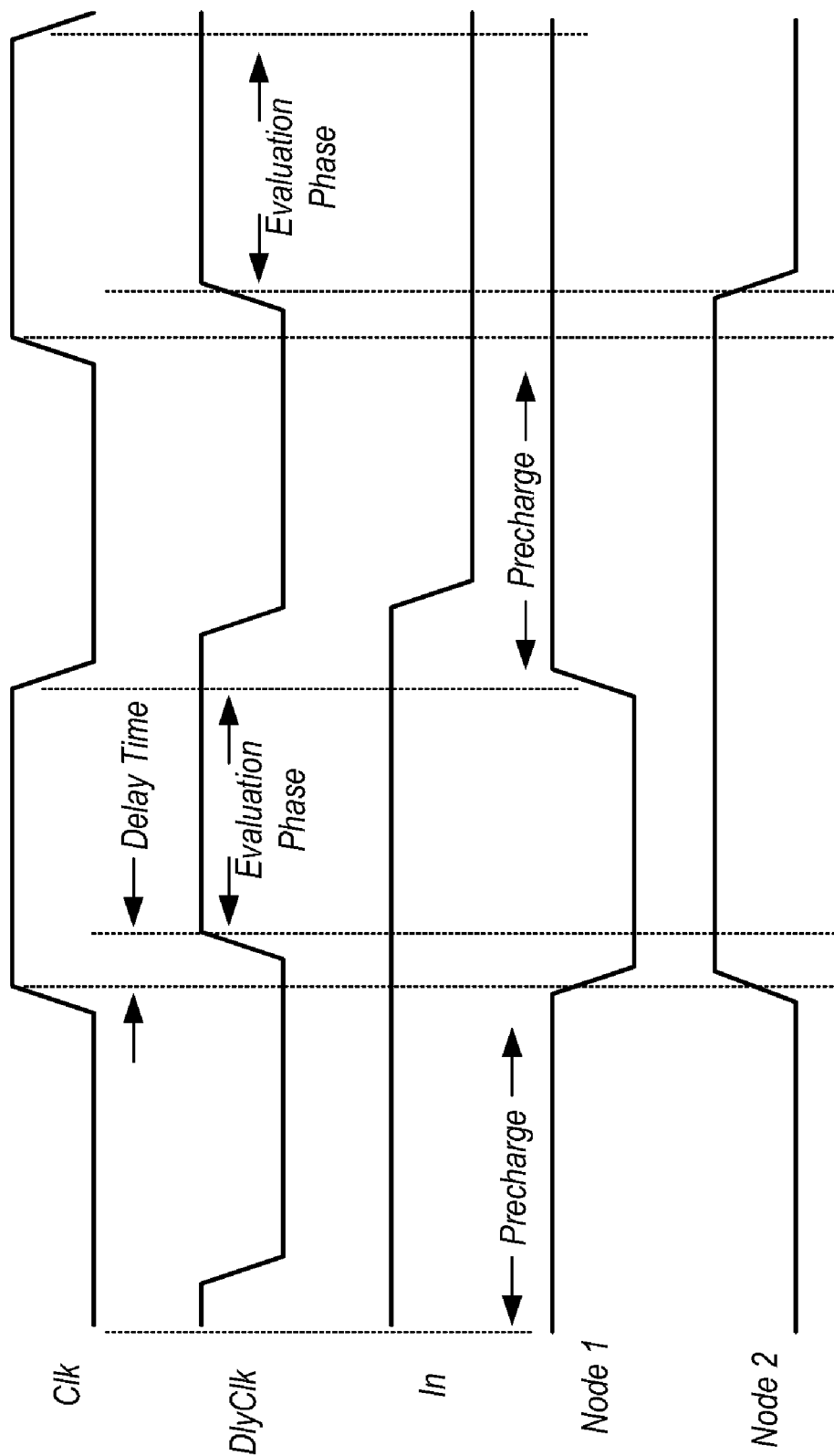
FIG. 4 is a timing diagram illustrating the operation of one embodiment of a latch circuit.

Timing Diagram:

Turning now to FIG. 4, a timing diagram illustrating operation of one embodiment of a latch circuit (e.g., one of latch circuits 10, 20, and/or 30 discussed above) is shown. The example shown begins with the clock signal ('Clk') low. Since the clock signal is low, a precharge may drive Node 1 high. The input signal ('In') is initially high in this example, and thus transistor N1 is active. Since the input signal is high, Node 1 is pulled low through transistor N1 after the clock signal transitions high and thus ends the precharge operation. Responsive to Node 1 falling low, pull-up transistor P2 may become active, and thus Node 2 is pulled high. Furthermore, Node 2 remains high in this example even after the evaluation phase ends and the clock signal once again falls low.

Responsive to the clock signal falling low, precharge transistor P4 may become active, thereby pulling Node 1 high. Since Node 2 is part of a static logic circuit, it may thus remain unaffected by the precharge of Node 1. In this example, the input signal falls low subsequent to the clock signal falling low and prior to its next rising edge. A low input signal may thus result in the de-activation of transistor N1. The precharge cycle may again end responsive to the transitioning of the clock signal from low to high. Since N1 was turned off due to the input signal falling low, Node 1 may remain high after precharge transistor P4 is de-activated by the low-to-high transition of the clock signal. The high on Node 1 may be held by the half-keeper circuit via a pull-up path through transistor P1 to Vdd. The high on Node 1 may ensure that pull-down transistor N3 is active even after the precharge cycle ends, while discharge transistor N5 may become active when the clock signal transitions from low to high. After the delay time has elapsed, discharge transistor N4 may also become active. When transistors N3, N4, and N5 are all active at the same time, a pull-down path may be provided between Node 2 and ground. As a result, Node 2 may be pulled low. As shown in the timing diagram, the evaluation phase occurs concurrently with the high phase of the clock cycle, beginning at a delay time subsequent to the clock signal transitioning high and ending when the clock signal falls low again. Since the evaluation phase in the circuits shown in FIGS. 1-3 is defined by the arrangement of the pull-down path (i.e. through discharge transistors N4 and N5), it primarily affects the high-to-low transition of Node 2.

Figure 5:
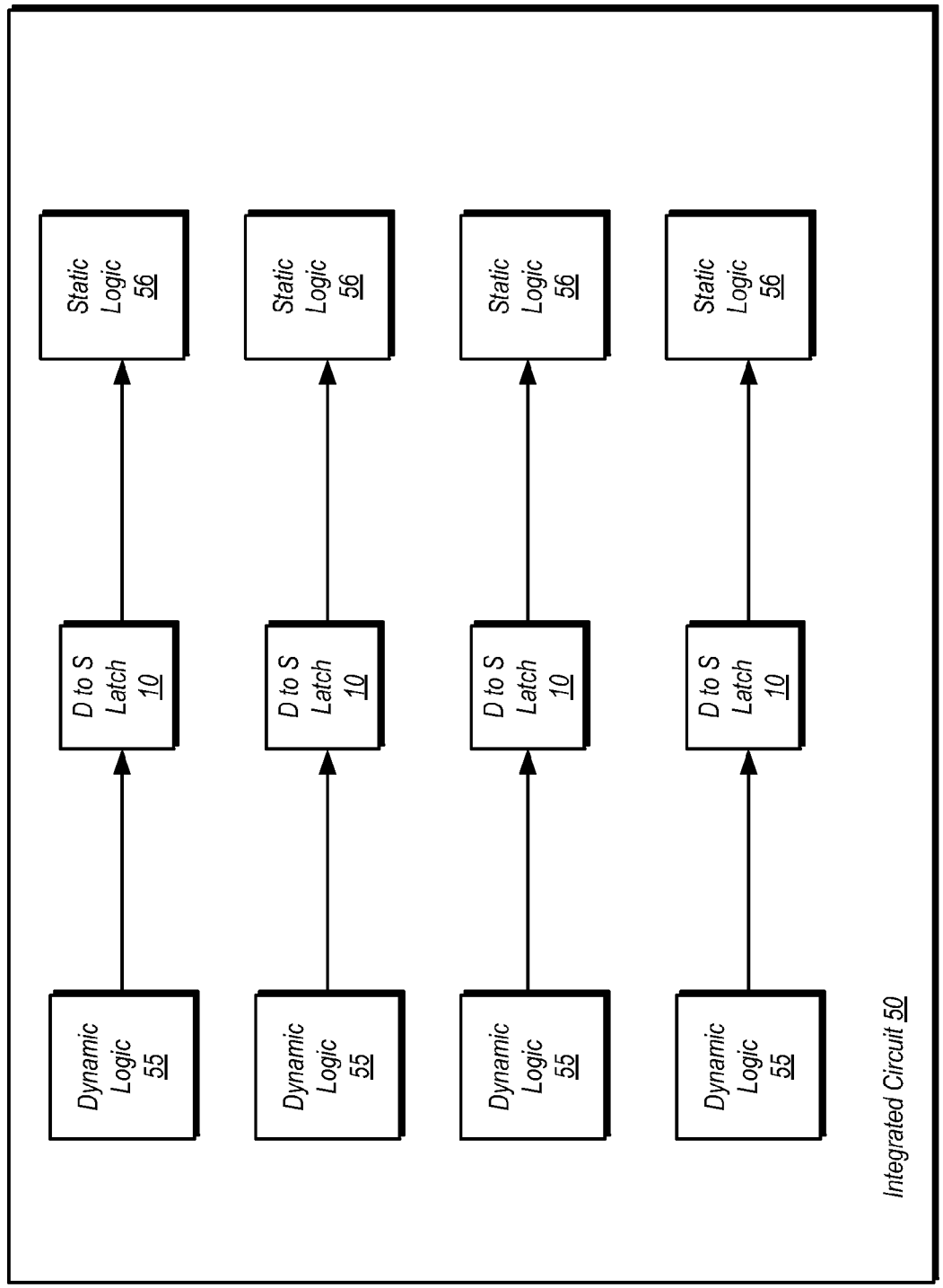
FIG. 5 is a block diagram of one embodiment of an integrated circuit.

Integrated Circuit:

FIG. 5 is a drawing illustrating one embodiment of an integrated circuit (IC). It should be noted that this drawing is presented for illustrative purposes, and that IC 50 may include other functional units/circuitry than that shown here.

In the embodiment shown, IC 50 includes a plurality of dynamic logic circuits 55. As discussed above, dynamic logic circuits may be combinational logic circuits that operate according to a clock, with a precharge phase (e.g., when the clock is low) and an evaluation phase (e.g., when the clock is high). Each of dynamic logic circuits 55 in this example is coupled to a dynamic-to-static latch circuit 10, such as that described above with reference to FIG. 1. It is noted however that latch circuits 20 and 30 of FIGS. 2 and 3, respectively, may also be used. Embodiments that utilize two or more of the embodiments discussed above are also possible and contemplated.

Each dynamic-to-static latch circuit 10 in the embodiment shown is coupled to receive an output signal from a corresponding dynamic logic circuit 55, and is configured to provide a logic signal to a corresponding static logic circuit 56, in accordance with the operation described above. Each static logic circuit 56 may include various combinational logic circuits or other type of circuitry wherein it is not required or desired to otherwise clock the inputs and/or outputs as in dynamic logic circuits. Thus, the dynamic-to-static logic circuits 10 (or 20 or 30) may be useful for interfacing dynamic logic circuits to static logic circuits in situations where communication between the two types of circuitry is necessary.

Figure 6:
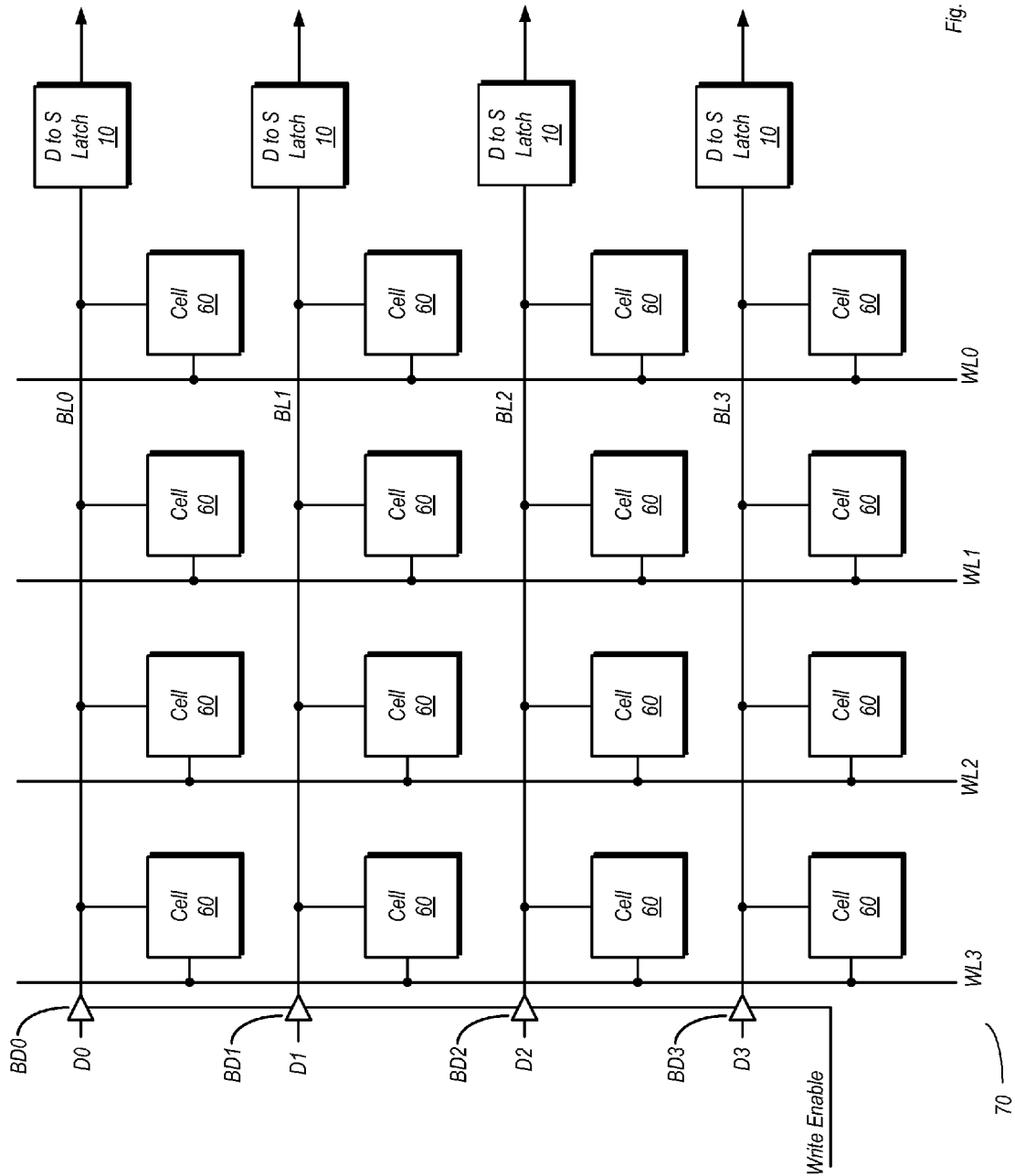
FIG. 6 is a block diagram of a register file.

Register File:

FIG. 6 is a block diagram of one embodiment of a register file 70 that utilizes dynamic-to-static latch circuits 10 for the output of data and/or the input of data. This is one of a number of different types of applications for which the circuits discussed above may be utilized. It is also noted that other embodiments of a dynamic-to-static latch circuit may be used with a register file, including those discussed above with reference to FIGS. 2 and 3.

In the embodiment shown, register file 70 includes a plurality of storage cells 60 each configured to store a bit of information. Register file 70 also includes a plurality of bit lines, BL0-BL3, and a plurality of word lines, WL0-WL3. Each bit line and each word line is coupled to a plurality of cells. Each of bit lines BL0-BL3 may be used to convey bits of information to or from the storage cells 60 to which it is coupled. Each of word lines WL0-WL3 may be used to select groups of cells for read and write operations. An assertion of a signal on a given one of word lines WL0-WL3 may select the coupled group of storage cells 60 for read or write operations. If none of word lines WL0-WL3 has a signal asserted thereupon, then no read or write operations occur in this embodiment.

The bit line outputs may by inputs to the dynamic-to-static latch circuits 10 as shown in FIG. 6. Thus, when a read occurs, the dynamic-to-static latch circuits 10 may provide static output values to the logic receiving the output of the register file 70.

To conduct a read operation, the word line WL0-WL3 corresponding to the register being read may be asserted. The storage cells 60 coupled to asserted word line may drive the bit lines BL0-BL3 based on the value stored in the cells 60. The dynamic-to-static latch circuits 10 may capture the values, and provide the values on the outputs. Subsequently, the bit lines may be precharged for the next read operation to be performed. That latches 10 may retain the outputs during the precharge phase, thus providing static outputs to the receiving circuitry.

In this example, each of the bit lines is coupled to a corresponding one of bit line drivers BD0-BD3. Each bit line driver BD0-BD3 may be tri-stateable. In this example, each bit line driver BD0-BD3 is enabled when a write enable signal is asserted, and is otherwise disabled when the write enable signal is de-asserted. Accordingly, assertion of the write enable signal may allow for data to be written into selected ones of storage cells 60.

Embodiments are also possible and contemplated wherein instances of latch circuit 10 (or 20, or 30) are implemented on the write side instead of the read side. To conduct a write operation in such an embodiment, a signal may be asserted on one of the word lines WL0-WL3 to select a corresponding group of cells. Data signals D0-D3 may be received from corresponding dynamic logic circuits by latch circuits 10. These data signals may be output by the latch circuits 10, in accordance with their operation as described above, to corresponding ones of bit-line drivers BD0-BD3. The bit line drivers BD0-BD3 may be enabled by the assertion of the write enable signal. When bit line drivers BD0-BD3 are enabled, the data signals output by the latch circuits 10 may be driven to the selected ones of storage cells 60. After sufficient time has been provided to allow the data to be written into the selected cells, the write enable signal may be de-asserted, while the word line corresponding to the selected cells may be deselected. It should be noted that embodiments are possible and contemplated wherein no bit line drivers BD0-BD3 are used. For example, if an embodiment included a latch circuit 10 on the input side of the bit lines, inverter I3 could be made to be tri-stateable, with sufficient drive strength for driving data signals to the data cells.

Figure 7:
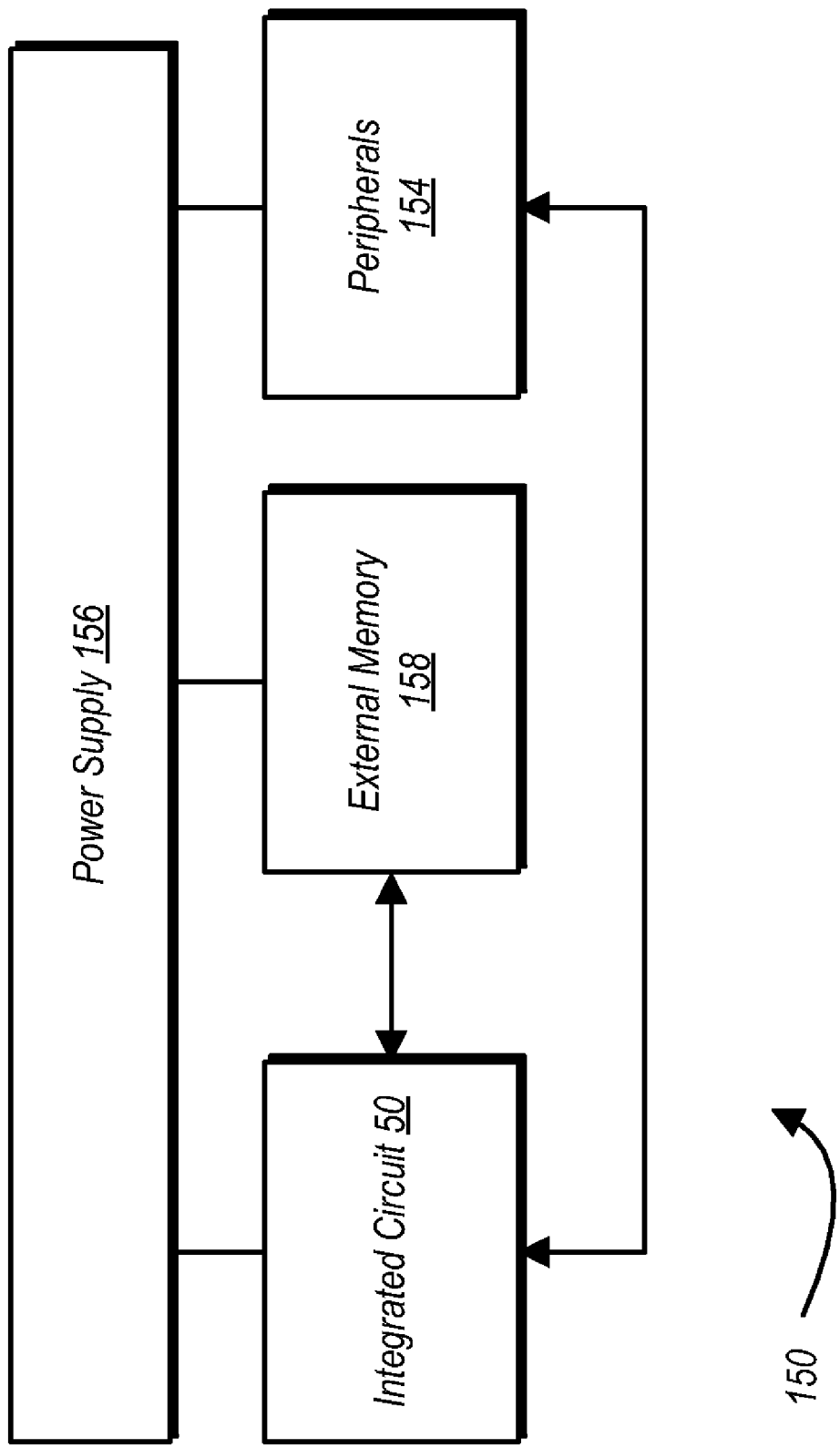
FIG. 7 is a block diagram of a system.

Exemplary System:

Turning next to FIG. 7, a block diagram of one embodiment of a system 150 is shown. In the illustrated embodiment, the system 150 includes at least one instance of an IC 50 (from FIG. 5) coupled to one or more peripherals 154 and an external memory 158. A power supply 156 is also provided which supplies the supply voltages to the IC 50 as well as one or more supply voltages to the memory 158 and/or the peripherals 154. Thus, the power supply 156 may include the voltage regulator 18 shown in FIG. 1. In some embodiments, more than one instance of the IC 50 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A circuit comprising:
   a precharge transistor coupled between a voltage supply node and a precharge node and configured to precharge the precharge node during a first phase of a clock signal;
   an input circuit coupled to receive an input data signal and configured to convey, based on a state of the input data signal, a first logic state to the precharge node during a second phase of the clock signal, wherein the input circuit comprises an input transistor coupled between the precharge node and a ground node and having a gate terminal configured to receive the input data signal; and
   an evaluation circuit including:
   a pull-up transistor coupled between the supply voltage node and a transfer node and having a gate terminal coupled to the precharge node;
   a discharge circuit including a first discharge transistor and a second discharge transistor;
   a delay circuit coupled to receive the clock signal and configured to delay the clock signal by a delay time; and
   a pull-down transistor having a gate terminal coupled to the precharge node, wherein the pull-down transistor is coupled between the ground node and the first discharge transistor, wherein the first discharge transistor is coupled between the pull-down transistor and the second discharge transistor, and wherein the second discharge transistor is coupled between the first discharge transistor and the second pull-up transistor;
   wherein the first discharge transistor is configured to activate responsive to the clock signal transitioning to the second phase, wherein the second discharge transistor is configured to activate at the delay time subsequent to the to the clock signal transitioning to the second phase, wherein the evaluation circuit is configured to convey a second logic state to the transfer node responsive to at least the clock signal transitioning to the second phase.

2. The circuit as recited in claim 1, wherein the evaluation circuit is configured to, when the first logic state is a logic high and the second logic state is a logic low, convey the second logic state to the transfer node responsive to both the clock signal and the delayed clock signal transitioning to the second phase.

3. A circuit comprising:
   a precharge transistor coupled between a voltage supply node and a precharge node and configured to precharge the precharge node during a first phase of a clock signal;
   an input circuit coupled to receive an input data signal and configured to convey, based on a state of the input data signal, a first logic state to the precharge node during a second phase of the clock signal; and
   an evaluation circuit including:
   a second pull-up transistor coupled between the supply voltage node and a transfer node and having a gate terminal coupled to the precharge node;

a discharge circuit including a first discharge transistor and a second discharge transistor wherein the discharge circuit further comprises a pull-down transistor having a gate terminal coupled to the precharge node, wherein the pull-down transistor is coupled between a ground node and the first discharge transistor, wherein the first discharge transistor is coupled between the pull-down transistor and the second discharge transistor, and wherein the second discharge transistor is coupled between the first discharge transistor and the second pull-up transistor; and a delay circuit coupled to receive the clock signal and configured to delay the clock signal by a delay time;

wherein the first discharge transistor is configured to activate responsive to the clock signal transitioning to the second phase, wherein the second discharge transistor is configured to activate at the delay time subsequent to the to the clock signal transitioning to the second phase, wherein the evaluation circuit is configured to convey a second logic state to the transfer node responsive to at least the clock signal transitioning to the second phase.

4. The circuit as recited in claim 3, wherein the evaluation circuit is configured to, when the first logic state is a logic high and the second logic state is a logic low, convey the second logic state to the transfer node responsive to both the clock signal and the delayed clock signal transitioning to the second phase.

5. The circuit as recited in claim 3, further comprising an output circuit coupled to the evaluation circuit and configured to drive an output signal at the first logic value responsive to the evaluation circuit evaluating the input data signal during the second phase of the clock cycle.

6. The circuit as recited in claim 5, wherein the output circuit includes a keeper configured to hold a state of the output signal subsequent to the clock signal transitioning from the second phase to the first phase.

7. A latch comprising:
a precharge circuit configured to precharge the first data node during a first phase of a clock signal; and
a transfer circuit configured to, based on a first logic value present on the first data node during a second phase of the clock signal, convey a second logic value to a second data node, wherein the transfer circuit includes a discharge circuit configured to be active during an evaluation phase beginning at a delay time subsequent to a beginning of the second phase of the clock signal and completing at an end of the second phase of the clock signal;
wherein the discharge circuit includes a pull-down transistor having a gate terminal coupled to the first data node, wherein the pull-down transistor is coupled between a ground node and a first discharge transistor, wherein the first discharge transistor is coupled between the pull-down transistor and a second discharge transistor, and wherein the second discharge transistor is coupled between the first discharge transistor and the second data node.

8. The latch as recited in claim 7, wherein the transfer circuit further includes:
a pull-up transistor coupled between the second data node and a voltage supply node and having a corresponding gate terminal coupled to the first data node, wherein the pull-up transistor, when active, provides a pull-up path between the second data node and the voltage supply node;
a pull-down transistor coupled to the discharge circuit, wherein the pull-down transistor, when active during the evaluation phase, provides a pull-down path between the second data node and the ground node via the discharge circuit.

9. The latch as recited in claim 8, wherein the discharge circuit further includes a delay circuit coupled to receive the clock signal and configured to provide the clock signal to the gate terminal of the second discharge transistor at the delay time subsequent to the first discharge transistor receiving the clock signal.

10. A register file comprising:
a plurality of storage cells;
a bit line coupled to one or more of the plurality of storage cells; and
a latch circuit coupled to receive a bit from the bit line, the latch circuit including:
a precharge circuit configured to precharge the first node during a first phase of a clock signal;
an input circuit coupled to receive a bit having a first logic value to be written to one of the plurality of cells, wherein the input circuit is coupled between an input node and a first node, wherein the input circuit is configured to drive a signal having a second logic value onto the first node during a second phase of the clock signal;
a transfer circuit configured to, drive a signal having the first logic value onto a second node during an evaluation phase that is concurrent with the second phase of the clock signal, the evaluation phase beginning at a delay time subsequent to a beginning of the second phase of the clock signal and completing at an end of the second phase of the clock signal;
an output circuit coupled to circuit coupled to the transfer circuit and configured to drive an output signal at the first logic value onto the bit line responsive to the transfer circuit driving the signal at the first logic value onto the second node during the evaluation phase; and
a discharge circuit having a pull-down transistor, wherein a gate terminal of the pull-down transistor is coupled to the precharge node, wherein the pull-down transistor is coupled between a ground node and a first discharge transistor, wherein the first discharge transistor is coupled between the pull-down transistor and a second discharge transistor, and wherein the second discharge transistor is coupled between the first discharge transistor and the second node.

11. The register file as recited in claim 10, wherein the output circuit includes:
a keeper circuit coupled to the second node and a third node, wherein the keeper circuit is configured to store the first logic value on the second node and the second logic value on the third node; and
an inverter having an input coupled to the third node and an output coupled to the bit line.

12. The register file as recited in claim 10, wherein the discharge circuit further includes a delay circuit coupled to receive the clock signal and configured to produce a delayed clock signal by delaying the received clock signal by the delay time, wherein a gate terminal of the second discharge transistor is coupled to receive the delayed clock signal and wherein a gate terminal of the first discharge transistor is coupled to receive the clock signal.

13. The register file as recited in claim 10, wherein the input circuit further includes a half-keeper circuit, wherein the half-keeper circuit includes a second pull-up transistor coupled between the voltage supply node and the first node, and an inverter having an input terminal coupled to the first node and an output terminal coupled to a gate terminal of the second pull-up transistor.

14. The register file as recited in claim 10, wherein the delay circuit implements one of the following:
an even number of inversions of the clock signal;
zero inversions of the clock signal.

15. An integrated circuit comprising:
at least one dynamic logic circuit;
at least one static logic circuit, and
at least one dynamic-to-static converter circuit coupled between the dynamic logic circuit and the static logic circuit, the dynamic-to-static converter circuit including:
a dynamic circuit having a precharge transistor configured to precharge a first node during a first phase of a clock signal, and an input transistor coupled to receive a logic signal at a first logic value and configured to drive the first node to a second logic value during a second phase of the clock signal;
a transition circuit configured to drive the first logic value onto a second node during an evaluation phase concurrent with the second phase of the clock signal, wherein the evaluation phase begins at a delay time subsequent to entering the second phase of the clock signal and terminating at an end of the second phase of the clock signal;
a storage circuit configured to store the first logic value on the second node and the second logic value on a third node subsequent to terminating the evaluation phase; and
a discharge circuit including a pull-down transistor having a gate terminal coupled to the first node, wherein the pull-down transistor is coupled between a ground node and a first discharge transistor, wherein the first discharge transistor is coupled between the pull-down transistor and a second discharge transistor, and wherein the second discharge transistor is coupled between the first discharge transistor and the second node.

16. The integrated circuit as recited in claim 15, wherein the discharge circuit further includes a delay circuit coupled to receive the clock signal and configured to delay the clock signal by the delay time to produce a delayed clock signal, wherein a gate terminal of the first discharge transistor is coupled to receive the clock signal and wherein a gate terminal of the second discharge transistor is coupled to receive the delayed clock signal.

17. The integrated circuit as recited in claim 15, wherein the transition circuit further includes a pull-up transistor having a gate terminal coupled to the first node, wherein the pull-up transistor is configured to, when active, provide a pull-up path between the second node and a voltage supply node.

18. A dynamic-to-static latch circuit comprising:
a dynamic circuit including an input transistor and a precharge transistor each coupled to a first data node, wherein the precharge transistor is configured to precharge the first data node during a first phase of a clock signal and wherein the input transistor is configured to convey a first logic value to the first data node;
a transition circuit configured to convey a second logic value to a second data node during an evaluation phase that is concurrent with a second phase of the clock signal, the transition circuit including a pull-up transistor, a pull-down transistor, and a discharge circuit, wherein the discharge circuit is configured to be active during the evaluation phase, the evaluation phase beginning at a delay time subsequent to entering the second phase of the clock signal and terminating upon completion of the second phase of the clock signal, wherein the discharge circuit includes the pull-down transistor having a gate terminal coupled to the first data node, wherein the pull-down transistor is coupled between a ground node and a first discharge transistor, wherein the first discharge transistor is coupled between the pull-down transistor and a second discharge transistor, and wherein the second discharge transistor is coupled between the first discharge transistor and the second data node; and
a static circuit configured to store the second logic value on the second data node subsequent to termination of the evaluation phase.

19. The dynamic-to-static converter circuit as recited in claim 18, wherein the discharge circuit further a delay circuit coupled to receive the clock signal and configured to produce a delayed clock signal by delaying the received clock signal by the delay time, wherein a gate terminal of the first discharge transistor is coupled to receive the clock signal and wherein a gate terminal of the second discharge transistor is coupled to receive the delayed clock signal.

20. The dynamic-to-static converter circuit as recited in claim 18, wherein the transition circuit further includes a pull-up transistor coupled between the second data node and a voltage supply node and having a gate terminal coupled to the first data node, wherein the pull-up transistor is configured to, when active, provide a pull-up path between the second data node and the voltage supply node.

* * * * *